United States Patent
Kouno et al.

(10) Patent No.: US 9,153,625 B2
(45) Date of Patent: Oct. 6, 2015

(54) NON-VOLATILE SEMICONDUCTOR MEMORY DEVICE

(71) Applicant: PANASONIC CORPORATION, Osaka (JP)

(72) Inventors: Kazuyuki Kouno, Osaka (JP); Takanori Ueda, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/340,508

(22) Filed: Jul. 24, 2014

(65) Prior Publication Data

US 2014/0332752 A1 Nov. 13, 2014

Related U.S. Application Data

(63) Continuation of application No. PCT/JP2013/001103, filed on Feb. 26, 2013.

(30) Foreign Application Priority Data

Mar. 7, 2012 (JP) .................................. 2012-050135

(51) Int. Cl.

| | |
|---|---|
| *H01L 27/24* | (2006.01) |
| *G11C 13/00* | (2006.01) |
| *G11C 7/14* | (2006.01) |
| *G11C 11/16* | (2006.01) |
| *H01L 27/22* | (2006.01) |

(52) U.S. Cl.
CPC ............... *H01L 27/249* (2013.01); *G11C 7/14* (2013.01); *G11C 11/16* (2013.01);

(Continued)

(58) Field of Classification Search
CPC . H01L 27/249; H01L 27/2436; H01L 27/228; H01L 27/101; G11C 13/004; G11C 2013/0054; G11C 7/14; G11C 11/1673; G11C 2213/79
See application file for complete search history.

(56) References Cited

U.S. PATENT DOCUMENTS

| | | | | |
|---|---|---|---|---|
| 7,428,163 | B2 * | 9/2008 | Hoenigschmid et al. | ...... 365/148 |
| 7,548,451 | B2 * | 6/2009 | Oh et al. | ....................... 365/163 |

(Continued)

FOREIGN PATENT DOCUMENTS

| | | |
|---|---|---|
| JP | 2004-234707 A | 8/2004 |
| JP | 4249992 B2 | 1/2009 |
| JP | 2009-200123 A | 9/2009 |

OTHER PUBLICATIONS

Wataru Otsuka et al., "A 4Mb Conductive-Bridge Resistive Memory with 2.3GB/s Read-Throughout and 216MB/s Program-Throughout", 2011 IEE International Solid-State Circuits Conference, Digest of Technical Papers, Feb. 20, 2011, pp. 210-211.

(Continued)

*Primary Examiner* — Allison P Bernstein
(74) *Attorney, Agent, or Firm* — McDermott Will & Emery LLP (57) ABSTRACT

A non-volatile semiconductor memory device includes a plurality of series-coupled fixed resistance elements, a plurality of reference cell transistors, and reference word lines coupled to gates of the reference cell transistors, a first reference data line coupled to one end of a resistance path in which a plurality of fixed resistance elements are arranged, and a second reference data line coupled in common to one ends of the reference cell transistors. The other end of each of the reference cell transistors is coupled to one of coupling points of the fixed resistance elements or the other end of the resistance path.

20 Claims, 9 Drawing Sheets

(52) U.S. Cl.
CPC ......... *G11C 13/0004* (2013.01); *G11C 13/004* (2013.01); *G11C 13/0007* (2013.01); *G11C 13/0069* (2013.01); *G11C 13/0097* (2013.01); *H01L 27/228* (2013.01); *H01L 27/2436* (2013.01); *G11C 2013/0054* (2013.01); *G11C 2213/79* (2013.01)

(56) References Cited

U.S. PATENT DOCUMENTS

| | | | |
|---|---|---|---|
| 7,656,225 | B2 * | 2/2010 | Isobe et al. .................... 327/540 |
| 8,315,079 | B2 * | 11/2012 | Kuo et al. ....................... 365/72 |
| 2003/0090935 | A1 | 5/2003 | Hidaka |
| 2004/0090856 | A1 | 5/2004 | Hidaka |
| 2004/0114444 | A1 | 6/2004 | Matsuoka |
| 2005/0226042 | A1 | 10/2005 | Hidaka |
| 2010/0054020 | A1 | 3/2010 | Ueda |

OTHER PUBLICATIONS

International Search Report issued in International Application No. PCT/JP2013/001103 with Date of mailing Apr. 2, 2013, with English Translation.

* cited by examiner

|  | READ | RESET (PROGRAM) | SET (ERASE) |
|---|---|---|---|
| WL | Vg_read | Vg_reset | Vg_set |
| BL | Vread | Vreset | VSS |
| SL | VSS | VSS | Vset |
| OPERATION | "0"/"1" READ | HIGHER RESISTANCE ("0" DATA) | LOWER RESISTANCE ("1" DATA) |

FIG.11

NON-VOLATILE SEMICONDUCTOR MEMORY DEVICE

CROSS-REFERENCE TO RELATED APPLICATIONS

This is a continuation of International Application No. PCT/JP2013/001103 filed on Feb. 26, 2013, which claims priority to Japanese Patent Application No. 2012-050135 filed on Mar. 7, 2012. The entire disclosures of these applications are incorporated by reference herein.

BACKGROUND

The present disclosure relates to non-volatile semiconductor memory devices, and more particularly to techniques reducing circuit areas.

In recent years, mobile phones (including smart phones), portable music players, digital cameras, and tablet terminals have been particularly increasingly demanded as electronic devices. Accordingly, non-volatile semiconductor memory devices have also been increasingly demanded, and techniques have been actively developed to increase the capacity, reduce the sizes, and perform high-speed rewrite, high-speed reading, and operation with low power consumption.

At present, flash memories are major non-volatile memories. In flash memories, data is rewritten in a microsecond or millisecond order, and a voltage of 10 V or more is needed to rewrite data. This often hinders an improvement in the performance of setting devices mounting flash memories.

In recent years, new non-volatile memories have been actively developed, which rewrite data at high speed with low power consumption as compared to the flash memories. For example, there are variable resistance memories (e.g., resistive random access memory (ReRAM)) using variable resistance elements as memory elements. In the variable resistance memories, data is rewritten in a nanosecond order, and a voltage of about 1.8 V is needed to rewrite data, thereby increasing the speed and reducing the power consumption as compared to the flash memories.

Japanese Unexamined Patent Publication No. 2004-234707 shows a circuit configuration of a ReRAM. Each memory cell of the ReRAM is formed by coupling a variable resistance element and a cell transistor in series. The ReRAM sets the resistances of the variable resistance elements to be low or high, for example, within the range from 1 KΩ to 1 MΩ, thereby storing "0" data or "1" data, respectively.

Where the variable resistance element is in the low resistance state, a large memory cell current flows. Where the variable resistance element is in the high resistance state, a small memory cell current flows. This change in the memory cell current according to the state of the variable resistance element is utilized, that is, the difference in the memory cell current is detected using a sense amplifier circuit, thereby reading data stored in a memory cell.

A reference cell is used to generate a reference current to determine the difference in the memory cell current using the sense amplifier circuit. The sense amplifier circuit compares the memory cell current to the reference current to identify the data stored in the memory cell. The reference cell formed by coupling a fixed resistance element, which is, for example, a polysilicon resistive element, to a cell transistor in series. See, for example, Wataru Otsuka, et al., A 4 Mb Conductive-Bridge Resistive Memory with 2.3 GB/s Read-Throughput and 216 MB/s Program Throughput, 2011 IEEE International Solid-State Circuits Conference Digest of Technical Papers, April 2011, pp 210-211. The resistance of the fixed resistance element is set to the medium value between the low resistance and the high resistance of the variable resistance element of the memory cell. Then, the reference current value in read operation is the medium value of the memory cell current value indicating "0" data and "1" data. As a result, the sense amplifier circuit identifies the data stored in the memory cell.

In ReRAMs, various types of reference currents are generated in read operation. For example, various types of currents such as normal reading reference currents, program verification reference currents used for verification reading in rewriting, and erase verification reference currents are generated as reading reference currents. In some cases, various types of reference currents are additionally generated to correct variations in reference currents for normal reading, program verification, and erase verification, depending on chips.

For example, in Japanese Unexamined Patent Publication No. 2004-234707, FIG. 4 shows a reference cell including four circuits, each of which is formed by coupling a fixed resistance element and a cell transistor in series. Different reference currents are generated depending on which cell transistor is selected. That is, a necessary reference current is generated by selecting a desired cell transistor in accordance with the normal reading, the program verification, or the erase verification.

SUMMARY

However, the present inventors found that the ReRAM of Japanese Unexamined Patent Publication No. 2004-234707 has the following problems. Specifically, as described above, it is necessary to arrange a plurality of fixed resistance elements with resistances, for example, within the range of 1 KΩ to 1 MΩ in each reference cell to generate various reference currents. In general, fixed resistance elements made of polysilicon (i.e., polysilicon resistive elements) are arranged in semiconductor devices. General polysilicon resistive elements have sheet resistances ranging from hundreds Ω to about 1 KΩ. Numbers of polysilicon resistive elements are thus needed to form a plurality of fixed resistance elements of reference cells, which have resistances ranging from 1 KΩ to 1 MΩ. This increases the circuit area of the ReRAM.

On the other hand, there is no need to provide numbers of polysilicon resistive elements by forming fixed resistance elements using super high resistance elements by an exclusive semiconductor process, thereby reducing the circuit area. However, this means increases the flow of the manufacturing process of the variable resistance memory and costs of manufacture and chips.

In view of the problems, the present disclosure provides a non-volatile semiconductor memory device generating various types of reference currents with a reduced circuit area.

An example non-volatile semiconductor memory device includes a plurality of memory cells arranged in a matrix, each including a cell transistor and a variable resistance memory element coupled to one end of the cell transistor; a plurality of word lines corresponding to rows of the plurality of memory cells, and coupled in common to gates of the cell transistors included in the plurality of memory cells arranged in the respective rows; a plurality of first data lines corresponding to rows or columns of the plurality of memory cells, and coupled in common to the variable resistance memory elements included in the plurality of memory cells arranged in the respective rows or columns; a plurality of second data lines corresponding to the rows or the columns of the plurality of memory cells, and coupled in common to the other ends of the cell transistors included in the plurality of memory cells arranged in the respective rows or columns; a plurality of fixed resistance elements coupled in series; a plurality of reference cell transistors; a plurality of reference word lines corresponding to the plurality of reference cell transistors, and coupled to gates of the respective reference cell transistors; a first reference data line coupled to one end of a resistance path in which the plurality of fixed resistance elements are arranged; and a second reference data line coupled in common to one ends of the plurality of reference cell transistors. The other end of each of the plurality of reference cell transistors is coupled to any one of coupling points of the fixed resistance elements or the other end of the resistance path.

In this configuration, the first reference data line is coupled to the one end of the resistance path in which the plurality of series-coupled fixed resistance elements are arranged. Each reference cell transistor is coupled between the second reference data line and one of the coupling points of the fixed resistance elements or the other end of the resistance path. The gates of the reference cell transistors are coupled to the respective reference word lines.

When a reference word line is driven, the corresponding reference cell transistor is turned on, thereby forming a path through the second reference data line, the turned-on reference cell transistor, the fixed resistance element coupled to the transistor, and the first reference data line. Since the resistance of the path depends on the number of the fixed resistance elements included in the path, the resistance of the path changes depending on which reference word line is driven. A predetermined voltage is applied to the first and second reference data lines, thereby allowing a current (or a reference current) corresponding to the resistance to flow to the path.

The resistance of the path depends on which of the plurality of series-coupled fixed resistance elements is included in the path. That is, the plurality of paths share a fixed resistance element.

Therefore, the number of the fixed resistance elements for generating reference currents is reduced, thereby reducing the circuit area of the non-volatile semiconductor memory device.

The plurality of fixed resistance elements, the plurality of word lines, and the plurality of reference word lines are preferably made of equivalent materials. The plurality of fixed resistance elements are preferably arranged in parallel to at least the plurality of word lines or the plurality of reference word lines.

With this configuration, the plurality of fixed resistance elements and the plurality of reference word lines are made of the same material as the word lines, and the plurality of series-coupled fixed resistance elements are arranged in parallel to the word lines or the reference word lines, thereby efficiently arranging the fixed resistance elements.

DETAILED DESCRIPTION

An embodiment of the present disclosure will be described hereinafter with reference to the drawings.

Figure 1:
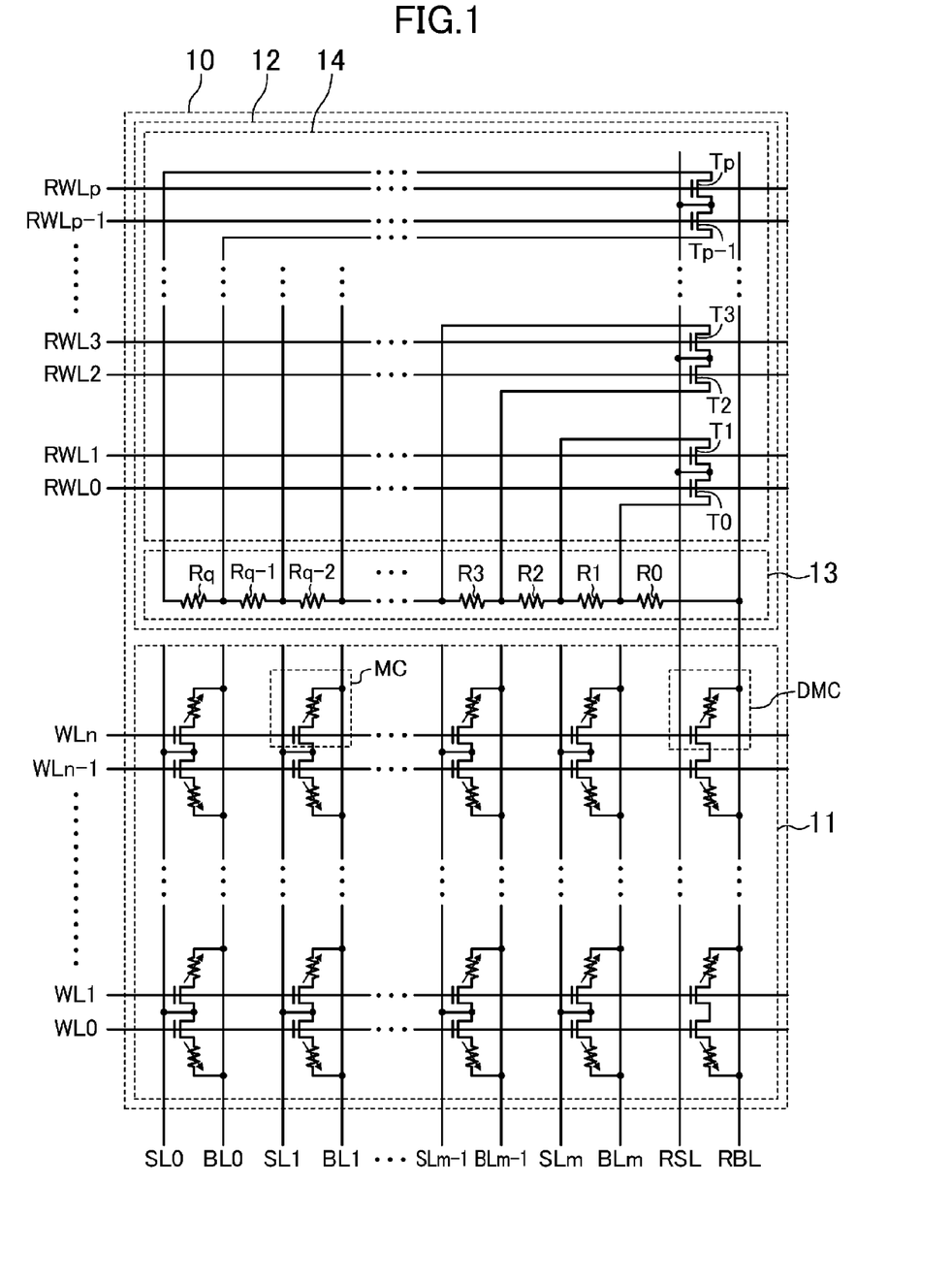
FIG. 1 is a configuration diagram of a memory array, which is the main part of a non-volatile semiconductor memory device according to an embodiment of the present disclosure.
Figure 2:
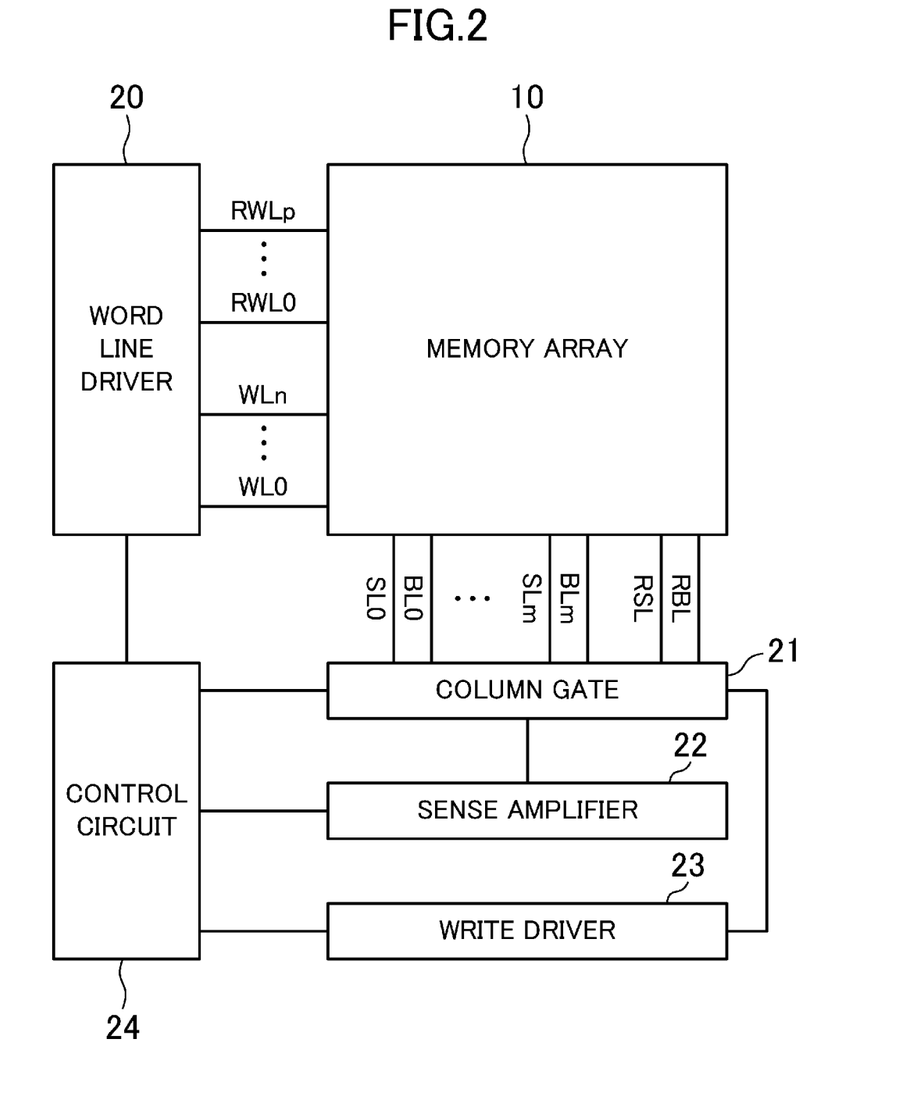
FIG. 2 is a block diagram illustrating the entire configuration of the non-volatile semiconductor memory device including the memory array of FIG. 1.

FIG. 1 is a configuration diagram of a memory array, which is the main part of non-volatile semiconductor memory device according to the embodiment of the present disclosure. FIG. 2 illustrates the entire configuration of the non-volatile semiconductor memory device including the memory array shown in FIG. 1. First, the entire configuration of the non-volatile semiconductor memory device will be described. Then, the details of the memory array according to this embodiment will be described.

As shown in FIG. 2, the non-volatile semiconductor memory device includes a memory array 10, a word line driver 20, a column gate 21, a sense amplifier 22, a write driver 23, a control circuit 24, a plurality of word lines WL0-WLn (hereinafter simply referred to as WL as appropriate), a plurality of bit lines BL0-BLm (hereinafter simply referred to as BL as appropriate) which are first data lines, a plurality of source lines SL0-SLm (hereinafter simply referred to as SL as appropriate) which are second data lines, a plurality of the reference word lines RWL0-RWLp (hereinafter simply referred to as RWL as appropriate), a reference bit line RBL as a first reference data line, and a reference source line RSL as a second reference data line. The suffix n of the word lines WL, the suffixes m of the source lines SL and the bit lines BL, and the suffix p of the reference word lines RWL are natural numbers.

In the memory array 10, a plurality of memory cells storing data, and a plurality of reference cells generating reference currents in read operation are arranged. The memory cells in the memory array 10 are coupled to the word lines WL0-WLn, the bit lines BL0-BLm, and the source lines SL0-SLm. The reference cells are coupled to the reference word lines RWL0-RWLp, the reference bit line RBL, and the reference source line RSL.

The word line driver 20 is a circuit, which receives input address signals (not shown), and selects and drives the word lines WL and the reference word lines RWL designated by the input address signals.

The column gate 21 is a circuit, which receives input address signals (not shown), selects the bit lines BL, the source lines SL, the reference bit line RBL, and the reference source line RSL designated by the input address signal, and couples the selected lines to the sense amplifier 22 or the write driver 23, which will be described later.

The sense amplifier 22 is a circuit, which determines whether data read by the memory cells in the memory array 10 is "0" data or "1" data. The column gate 21 selects one of the bit lines BL0-BLm, and couples the reference bit line RBL and the selected bit line BL to the sense amplifier 22, thereby reading data from the corresponding memory cell.

The write driver 23 is a circuit, which applies a rewrite voltage to one of the memory cells in rewrite operation of data in the memory cell. Specifically, the write driver 23 applies to the bit line BL or the source line SL selected by the column gate 21, a positive voltage where rewrite operation is performed in the memory cell, and a ground voltage where rewrite operation is not performed. The voltage supplied from the write driver 23 is applied to the selected bit line BL or the selected source line SL via the column gate 21.

The control circuit 24 controls operation modes such as read operation and rewrite operation of data, and controls the word line driver 20, the column gate 21, the sense amplifier 22, and the write driver 23 in accordance with the operation modes.

Referring back to FIG. 1, the memory array 10 includes a memory cell array 11 formed by arranging a plurality of memory cells MC in a matrix, and a reference cell array 12 formed by arranging a plurality of reference cells generating reference currents in read operation.

The memory cell array 11 includes the plurality of memory cells MC, the word lines WL0-WLn, the bit lines BL0-BLm, and the source lines SL0-SLm.

Each memory cell MC is formed by coupling a variable resistance memory element to a cell transistor in series. The variable resistance memory element records data utilizing variations in the resistance.

The word lines WL correspond to rows of the memory cells MC, and are coupled to the gates of the cell transistors included in the memory cells MC in a same row. The bit lines BL correspond to columns of the memory cells MC, and are coupled to one ends of the variable resistance memory elements included in the memory cells MC in a same column. The source lines SL correspond to the columns of the memory cells MC, and are coupled to one ends of the cell transistors in a same column That is, the memory cell array 11 includes (n+1)×(m+1) memory cells MC. While in this embodiment, dummy memory cells DMC coupled to the reference bit line RBL are arranged in the memory cell array 11, the dummy memory cells DMC may be omitted. The dummy memory cells DMC equalize the wiring load of the reference bit line RBL, through which a reference current flows, and the wiring loads of the bit lines BL, through which memory cell currents flow, in read operation of data. The dummy memory cells DMC do not store data. The memory cells MC and the dummy memory cells DMC have the same configuration.

Figure 3:
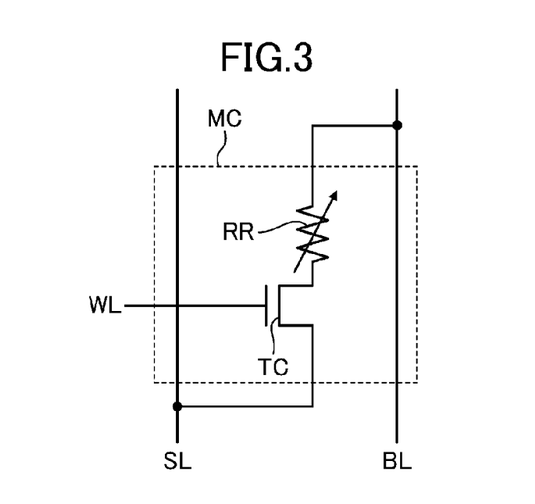
FIG. 3 illustrates an example configuration of a memory cell included in the memory array of FIG. 1.

FIG. 3 illustrates an example configuration of each memory cell according to this embodiment. In this embodiment, an example will be described where a variable resistance memory (ReRAM) uses a variable resistance element RR as a variable resistance memory element.

The memory cell MC is formed by coupling the variable resistance element RR to a cell transistor TC in series. The word line WL is coupled to the gate terminal of the cell transistor TC. The bit line BL is coupled to the variable resistance element RR. The source line SL is coupled to the source terminal of the cell transistor TC.

In this embodiment, an example has been described where the variable resistance element RR is coupled to the bit line BL, and the cell transistor TC is coupled to the source line SL. Alternatively, the cell transistor TC may be coupled to the bit line BL, and the variable resistance element RR may be coupled to the source line SL. In short, each memory cell according to this embodiment is what is called a 1T1R variable resistance memory cell including a single cell transistor TC, and a single variable resistance element RR.

Figure 4:
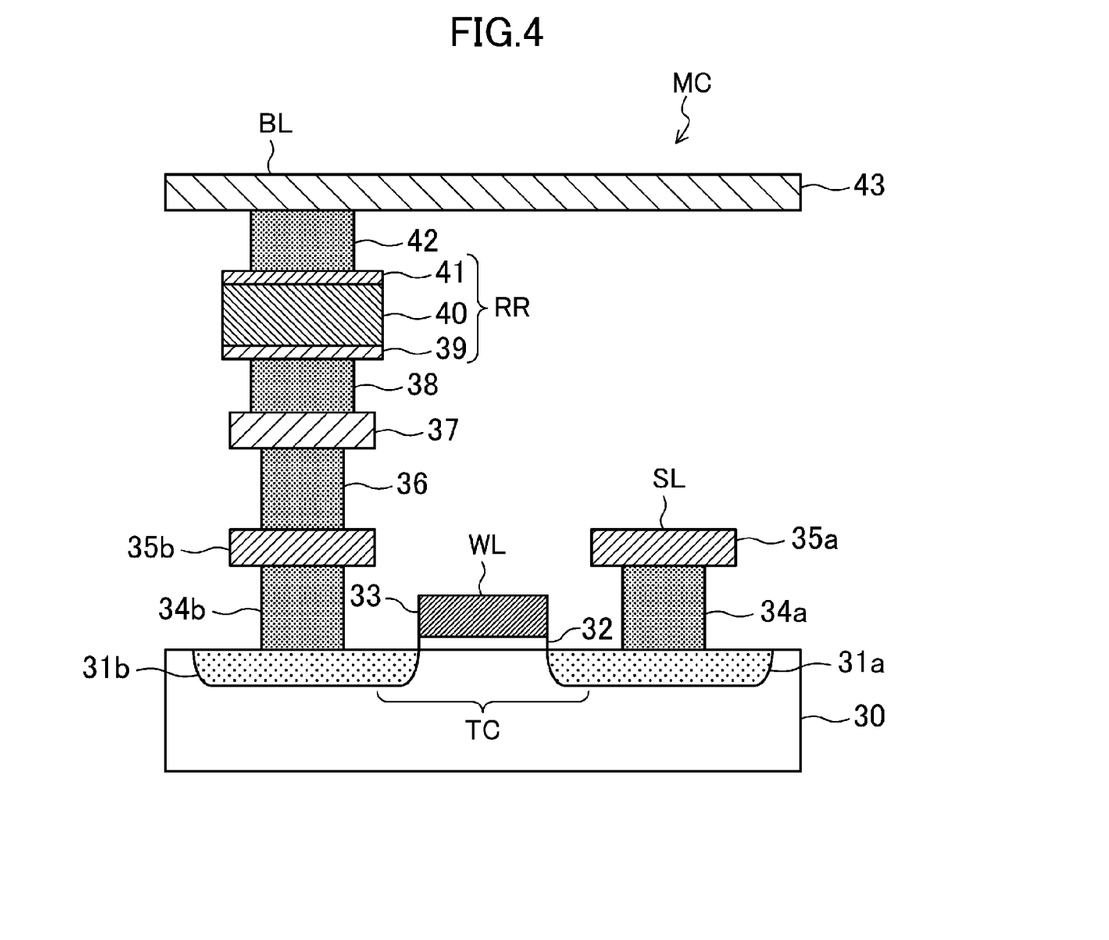
FIG. 4 is a cross-sectional view of the memory cell shown in FIG. 3.

FIG. 4 is a cross-sectional view of the memory cell shown in FIG. 3. In the memory cell MC, the diffusion regions 31a and 31b are formed in the semiconductor substrate 30. The diffusion region 31a functions as the source terminal of the cell transistor TC. The diffusion region 31b functions as the drain terminal of the cell transistor TC. The region between the diffusion regions 31a and 31b functions as the channel region of the cell transistor TC. An oxidation film 32, and a gate electrode 33 (i.e., the word line WL) made of, for example, polysilicon, are formed on the channel region, thereby functioning as the cell transistor TC.

The source terminal 31a of the cell transistor TC is coupled to the source line SL, which is a first wiring layer 35a, through a via 34a. The drain terminal 31b of the cell transistor TC is coupled to a first wiring layer 35b through a via 34b. The first wiring layer 35b is coupled to a second wiring layer 37 through a via 36. The second wiring layer 37 is coupled to the variable resistance element RR through a via 38.

The variable resistance element RR includes a lower electrode 39, a variable resistance layer 40, and an upper electrode 41. The variable resistance element RR is coupled to the bit line BL, which is a third wiring layer 43, through a via 42.

Referring back to FIG. 1, the reference cell array 12 includes the reference word lines RWL0-RWLp, the reference bit line RBL, and the reference source line RSL. The reference cell array 12 includes a fixed resistance element block 13, and a reference cell transistor block 14. The reference cell array 12 is column-wise adjacent to the memory cell array 11 at least one side.

The fixed resistance element block 13 is formed by coupling a plurality of fixed resistance elements R0-Rq (hereinafter simply referred to as R as appropriate) in series to form a resistance path. One end of the resistance path, that is, one end of the fixed resistance element R0 is coupled to the reference bit line RBL. The coupling points of the series-coupled fixed resistance elements R0-Rq are coupled to one ends of reference cell transistor T0-Tp (hereinafter simply referred to as T as appropriate), which will be described later, of the reference cell transistor block 14. The suffix q of the fixed resistance elements R and the suffix p of the reference cell transistors T are natural numbers.

The reference cell transistor block 14 includes the plurality of reference cell transistors T0-Tp. The reference cell transistors T correspond to the reference word lines RWL, and have gate terminals coupled to the respective reference word lines RWL0-RWLp. The source terminals of the reference cell transistors T are coupled in common to the reference source line RSL. The drain terminal of each reference cell transistors T is coupled to one of the plurality of fixed resistance elements R. The drain terminal of the reference cell transistor Tp is coupled to the other end of the resistance path (i.e., the fixed resistance element Rq). Which reference cell transistor T is coupled to which fixed resistance element R is determined as appropriate.

In most cases, fixed resistance elements used in a semiconductor device are generally polysilicon resistive elements. While in this embodiment, an example will described where fixed resistance elements R are polysilicon resistive elements, diffusion resistive elements etc., may be used as resistive elements other than the polysilicon resistive elements.

The series-coupled fixed resistance elements R are preferably arranged in parallel to the word lines WL and the reference word lines RWL. The reasons are as follows. The polysilicon as the material of the fixed resistance elements R is the same as the polysilicon as the material of the gate electrodes of the word lines WL and the reference word lines RWL. This parallel arrangement enables efficient layout design of the fixed resistance elements R. As a result, the area of the fixed resistance element block 13 reduces. The series-coupled fixed resistance elements R may be arranged in parallel to at least the word lines WL or the reference word lines RWL. That is, the word lines WL and the reference word lines RWL are not necessarily arranged in parallel.

The reference cell array 12 includes (p+1) reference cells having different fixed resistances. Each reference cell is formed by coupling the fixed resistance element R to the reference cell transistor T in series. Any one of the reference word lines RWL is driven to select corresponding one of the reference cells. For example, when the reference word line RWL0 is driven, the reference cell including the fixed resistance element R0 and the reference cell transistor T0 is selected. At this time, the current path coupling the reference bit line RBL, the fixed resistance element R0, the reference cell transistor T0, and the reference source line RSL is formed.

When the reference word line RWL1 is driven, the reference cell including the fixed resistance elements R0 and R1, and the reference cell transistor T1 is selected. As a result, the current path coupling the reference bit line RBL, the fixed resistance elements R0 and R1, the reference cell transistor T1, and the reference source line RSL is formed.

When the reference word line RWL2 is driven, the current path coupling the reference bit line RBL, the fixed resistance elements R0, R1, and R2, the reference cell transistor T2, and the reference source line RSL is formed. When the reference word line RWL3 is driven, the current path coupling the reference bit line RBL, the fixed resistance elements R0-R3, the reference cell transistor T3, and the reference source line RSL is formed.

When the reference word line RWLp-1 is driven, the current path coupling the reference bit line RBL, the fixed resistance elements R0-Rq-1, the reference cell transistor Tp-1, and the reference source line RSL is formed. When the reference word line RWLp is driven, the current path coupling the reference bit line RBL, the fixed resistance elements R0-Rq, the reference cell transistor Tp, and the reference source line RSL is formed.

As such, various types of current paths having different resistances are formed depending on the driven reference word lines RWL. The current paths may share the fixed resistance elements R. That is, in the reference cell array 12 according to this embodiment, the plurality of reference cells share the fixed resistance elements R.

When a voltage is applied from the sense amplifier 22 to, for example, the reference bit line RBL, a reference current corresponding to the resistance flows to the current path.

As described above, any one of the reference word lines RWL0-RWLp is driven in the reference cell array 12, thereby selecting one of the reference cells having different fixed resistances. That is, various types of reference currents are generated and supplied in read operation.

Next, the operation of the non-volatile semiconductor memory device according to this embodiment will be described with reference FIGS. 5-7.

Figure 5:
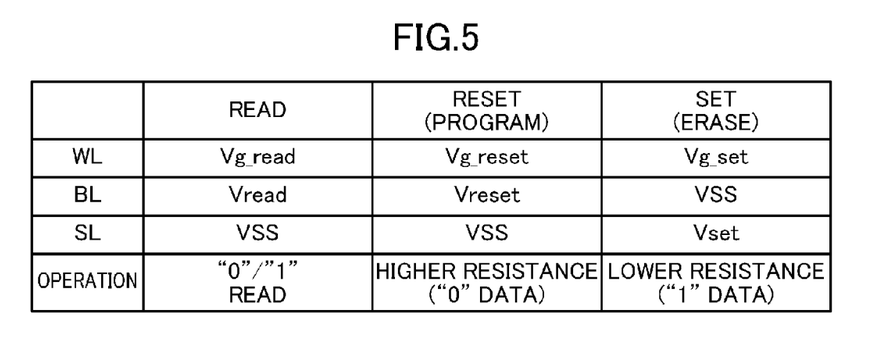
FIG. 5 illustrates the relation between operation modes of the non-volatile semiconductor memory device of FIG. 2 and voltages applied to memory cells.

FIG. 5 illustrates the relation between the operation modes of the non-volatile semiconductor memory device according to this embodiment, and the voltages applied to the memory cells.

In FIG. 5, in read operation of data, a gate voltage Vg_read (e.g., 1.8V) is applied to a word line WL, thereby turning on the corresponding cell transistor TC to apply a drain voltage Vread (e.g., 0.4 V) to the corresponding bit line BL, and a ground voltage VSS (0 V) to the corresponding source line SL. When the variable resistance element RR is in a high resistance state (in resetting or programming), a small memory cell current flows. On the other hand, when the variable resistance element RR is in a low resistance state (in setting or erasing), a large memory cell current flows. Therefore, the data stored in the memory cells MC is known by determining the difference between the current values using the sense amplifier 22.

In reset operation (i.e., program operation), a gate voltage Vg_reset (e.g., 2.4 V) is applied to a word line WL, thereby turning on the corresponding cell transistor TC to apply a drain voltage Vreset (e.g., 2.4 V) to the corresponding bit line BL, and the ground voltage VSS (0 V) to the corresponding source line SL. Accordingly, a positive voltage is applied to the upper electrode of the variable resistance element RR to change the variable resistance element RR to the high resistance state ("0" data).

In set operation (i.e., erase operation), a gate voltage Vg_set (e.g., 2.4 V) is applied to a word line WL, thereby turning on the corresponding cell transistor TC to apply the ground voltage VSS (0V) to the corresponding bit line BL, and a source voltage Vset (e.g., 2.4 V) to the corresponding source line SL. Accordingly, a positive voltage is applied to the lower electrode of the variable resistance element RR, and to change the variable resistance element RR to the low resistance state ("1" data).

In the reference cell array 12, in reset operation, one of the reference cells is selected such that the resistance of the current path is, for example, 80 KΩ. On the other hand, in set operation, one of the reference cells is selected such that the resistance of the current path is, for example, 20 KΩ. In read operation, one of the reference cells is selected such that the resistance of the current path is for example, 40 KΩ, as the medium value between the resistances of the current path in reset operation and in set operation.

Figure 6:
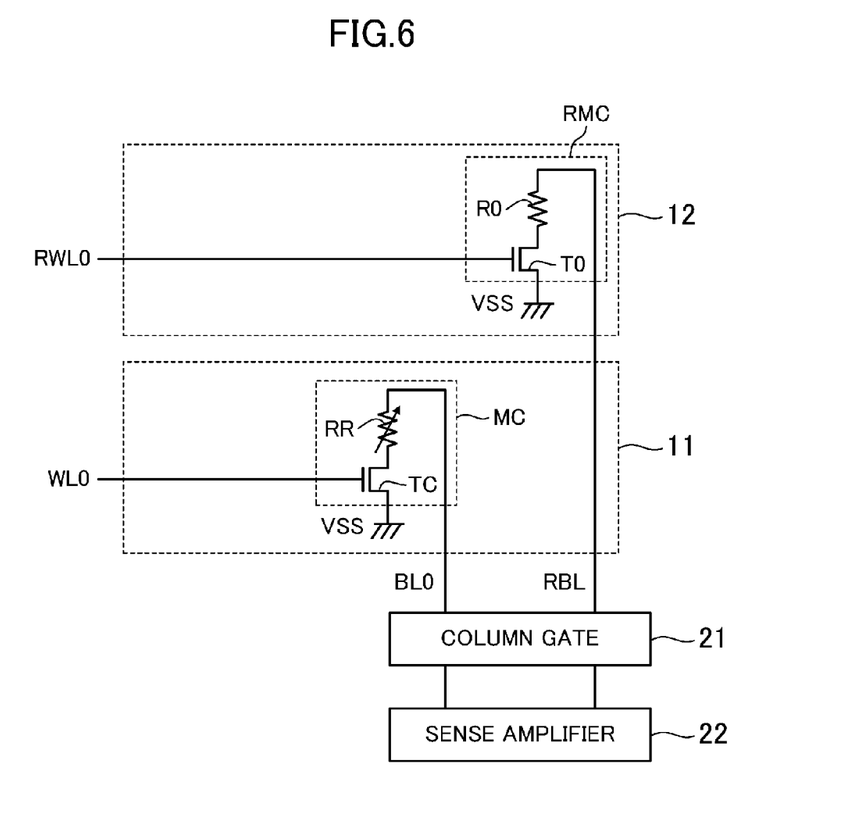
FIG. 6 illustrates an example memory cell and an example reference cell selected in read operation of the non-volatile semiconductor memory device of FIG. 2.

FIG. 6 illustrates an example memory cell and an example reference cell selected in read operation in the non-volatile semiconductor memory device according to this embodiment.

In FIG. 6, the memory cell MC coupled to the word line WL0 and the bit line BL0 of the memory cell array 11 and the reference cell RMC coupled to the reference word line RWL0 of the reference cell array 12 are selected. Since the ground voltage VSS (0 V) is applied to the source line SL0 and the reference source line RSL in read operation, FIG. 6 illustrates that the ground voltage VSS is applied to the source line SL and the reference source line RSL.

First, the column gate 21 couples the bit line BL0 and the reference bit line RBL to the sense amplifier 22. The word line WL0 and the reference word line RWL0 are driven, and the sense amplifier 22 applies the drain voltage (e.g., 0.4 V) to the bit line BL0 and the reference bit line RBL. As a result, a memory cell current corresponding to the resistance of the variable resistance element RR flows to the memory cell MC, and a reference current corresponding to the resistance of the fixed resistance element R0 flows to the reference cell RMC.

Where the memory cell current is smaller than the reference current, that is, where the variable resistance element RR is in the high resistance state, the sense amplifier 22 outputs "0" data. On the other hand, where the memory cell current is larger than the reference current, that is, where the variable resistance element RR is in the low resistance state, the sense amplifier 22 outputs "1" data. As such, data is read from the memory cell MC.

In read operation, the difference between the memory cell current and the reference current preferably depends only on the difference between the resistance of the variable resistance element RR and the resistance of the fixed resistance element R0. Thus, the cell transistor TC and the reference cell transistor T0 preferably have the same characteristics. Specifically, the gate oxidation films of the cell transistor TC and the reference cell transistor T0 may have the same thickness. The cell transistor TC and the reference cell transistor T0 may have the same gate channel length and the same gate channel width.

Figure 7:
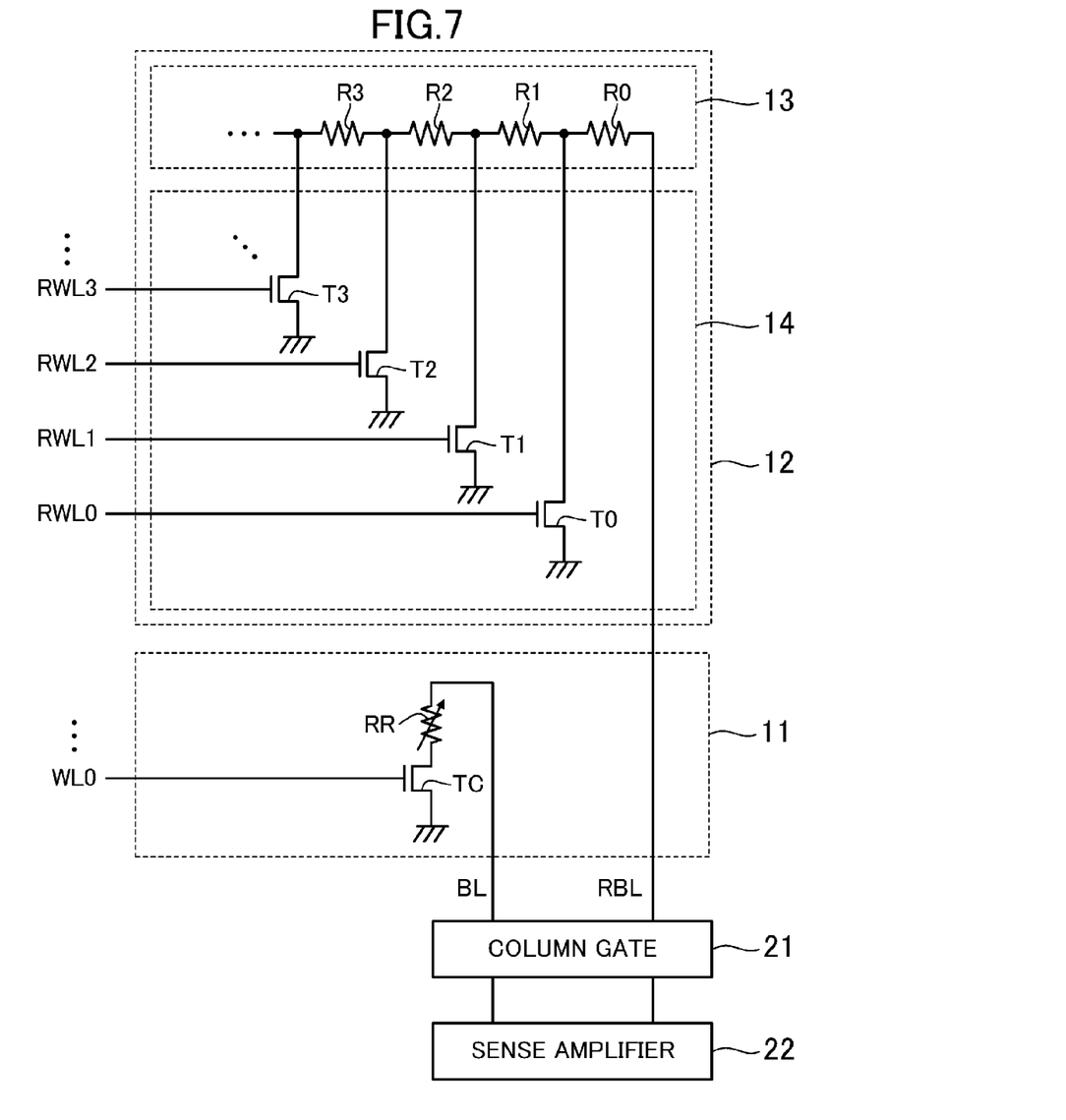
FIG. 7 illustrates a simplified example of the non-volatile semiconductor memory device of FIG. 2.

FIG. 7 illustrates a simplified example of the non-volatile semiconductor memory device according to this embodiment. FIG. 7 illustrates the circuit configuration of the reference cell array 12 more detailed than FIG. 6. As shown in FIG. 7, in the reference cell array 12 according to this embodiment, a plurality of reference cells share a fixed resistance element R. For this configuration, the drain terminals of the reference cell transistors T0-T3 are coupled to different nodes of the fixed resistance elements of the series-coupled fixed resistance elements R0-R3. With this configuration, the fixed resistance elements R0-R2 are shared by the different current paths, for example, where the reference cell transistor T3 is turned on, and where the reference cell transistor T2 is turned on.

Therefore, the number of the fixed resistance elements is reduced even in generating various types of reference currents. This point will be described below.

In FIG. 4 of Japanese Unexamined Patent Publication No. 2004-234707, four circuits are independently arranged, each of which includes a transistor and a fixed resistance element coupled in series, in a reference cell. The transistor of any one of the circuits is selected, thereby generating a reference current corresponding to the resistance of the fixed resistance element coupled to the transistor.

As described above, fixed resistance elements are often made of polysilicon. For convenience and illustration, assume that the resistance of each polysilicon resistive element is 1 KΩ. Assume that the resistances of the four independent circuits in FIG. 4 of Japanese Unexamined Patent Publication No. 2004-234707 are 10 KΩ, 20 KΩ, 40 KΩ, and 80 KΩ. In this case, the polysilicon resistive elements are needed in the same number as the resistances of the circuits to form the fixed resistance elements having the four resistances. That is, 150 polysilicon resistive elements are required, which is obtained from the equation, 10+20+40+80=150.

By contrast, in this embodiment, the fixed resistance elements R, which are polysilicon resistive elements, are shared by the plurality of reference cells. For example, where the resistance of each fixed resistance element R is 1 KΩ, the number of the fixed resistance elements R may be determined such that the combined resistance of the series-coupled fixed resistance elements R is, for example, 80 KΩ at maximum. That is, 80 fixed resistance elements R may be coupled in series. Therefore, for example, in order to form the current path has a resistance of 10 KΩ, the reference cell transistors T and the fixed resistance elements R may be coupled such that the current path includes the fixed resistance elements R0-R9.

As described above, in this embodiment, the plurality of reference cells share the fixed resistance elements R. Thus, while mitigating an increase in the circuit area of the reference cell array 12, various resistances are provided. That is, various reference currents are generated, and the circuit area of the non-volatile semiconductor memory device is reduced.

The fixed resistance elements R0-Rq preferably have the same resistance, but may have different resistances. That is, the resistances of the fixed resistance elements R0-Rq may be set as appropriate. With the decreasing resistance, and with the increasing number of fixed resistance elements R, a high accuracy reference current is generated.

In the reference cell array 12 according to this embodiment, the fixed resistance element block 13 may not be formed by arranging the plurality of fixed resistance elements R in a straight line.

Figure 8A:
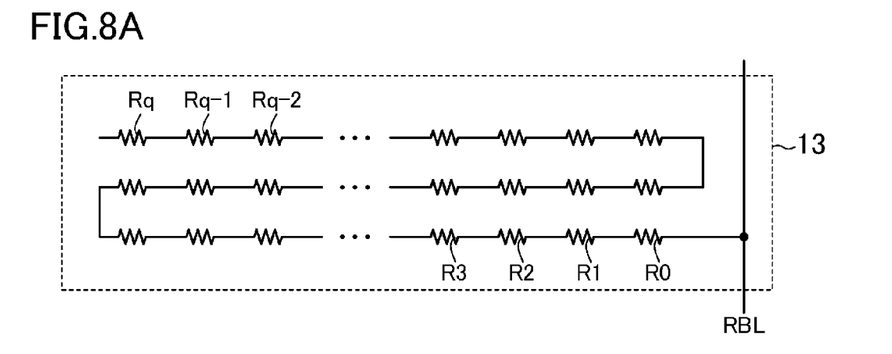
FIGS. 8A and 8B illustrate another example configuration of a fixed resistance element block included in a reference cell array of FIG. 1.
Figure 8B:
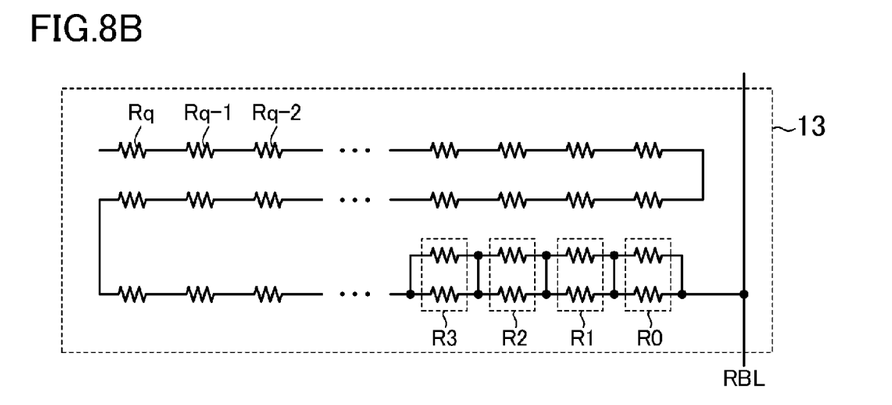

FIGS. 8A and 8B illustrate another example configuration of the fixed resistance element block in the reference cell array according to this embodiment.

For example, if the plurality of series-coupled fixed resistance elements R are difficult to arrange in a straight line due to the layout etc., the series-coupled fixed resistance elements R may be arranged in a plurality of rows and the rows may be coupled by a bending wire as shown in FIG. 8A. In FIG. 8A, the position(s) and the number of bending the wire coupling the fixed resistance elements R may be determined as appropriate.

Alternatively, at least one of the fixed resistance elements R0-Rq may be formed by coupling a plurality of fixed resistance elements in parallel. For example, as shown in FIG. 8B, fixed resistance element R0-R3 may be formed by coupling two fixed resistance elements in parallel.

Where the fixed resistance elements R having the same resistance are arranged in the fixed resistance element block 13, the obtained resistance is not lower than the resistance of the fixed resistance elements R. Where two fixed resistance elements are coupled in parallel to form each fixed resistance element R, the combined resistance becomes half. Therefore, the obtained resistance becomes more accurate. In FIG. 8B, the number of the fixed resistance elements R coupled in parallel, and the number of the fixed resistance elements coupled in parallel may be determined as appropriate.

In the non-volatile semiconductor memory device shown in FIG. 1, dummy reference cell transistors are preferably coupled to the reference word lines RWL.

Figure 9A:
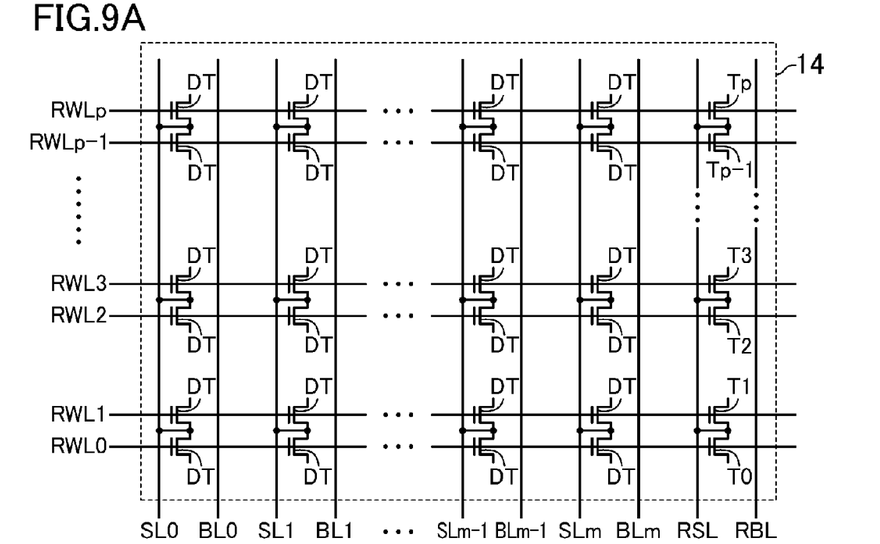
FIGS. 9A and 9B are configuration diagrams of dummy transistors arranged in the reference cell transistor block of FIG. 1.
Figure 9B:
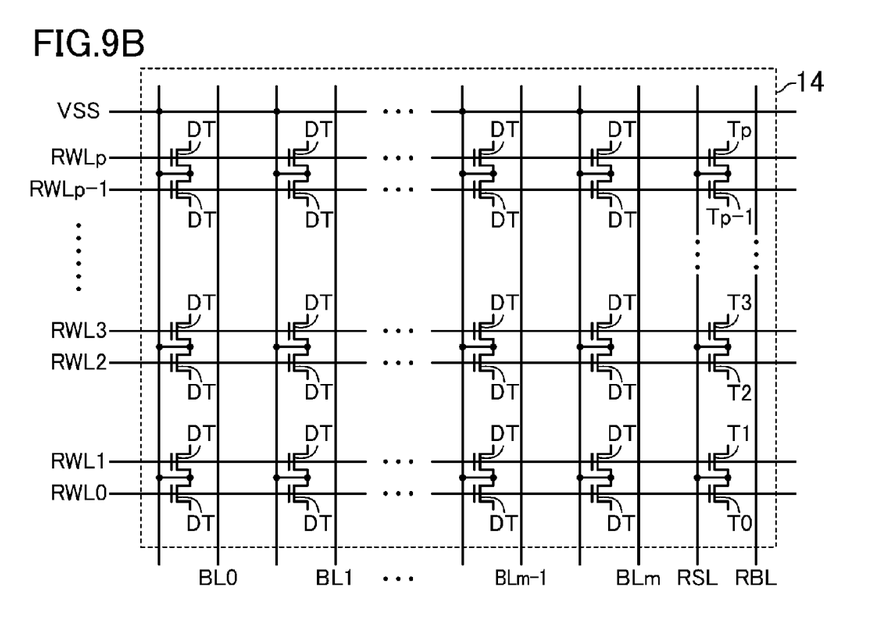

FIGS. 9A and 9B are configuration diagrams of the reference cell transistor block according to this embodiment formed by arranging dummy reference cell transistors.

As shown in FIG. 9A, in the reference cell transistor block 14, a plurality of dummy reference cell transistors DT and a plurality of reference cell transistors T are arranged in a matrix. The gates of the dummy reference cell transistors DT and the reference cell transistor T arranged in the same row are coupled to the same reference word line RWL. At least one of the drain terminal or the source terminal of each dummy reference cell transistor DT may be open.

With this configuration, in read operation of data, when a predetermined word line WL and a predetermined reference word line RWL are driven, the drive load capacitance of the word line WL and the reference word line RWL are equal. This synchronizes the rising times, and the falling times of the word line WL and the reference word line RWL, thereby providing high-accuracy, high-speed read operation.

In order to equalize the same load capacitances of the word lines WL and the reference word lines RWL, the number of the cell transistors TC coupled to each word line WL (including the cell transistors of the dummy memory cells DMC shown in FIG. 1) is preferably equal to the sum of the numbers of the dummy reference cell transistors DT and the reference cell transistors T coupled to each reference word line RWL.

The cell transistors TC, the reference cell transistors T, and the dummy reference cell transistors DT preferably have the same configuration. Specifically, the gate oxidation films of the transistors preferably have the same thickness, or the transistors preferably have the same gate channel length and the same gate channel width.

The bit lines BL and the reference bit line RBL preferably have the same drive load capacitance. The source lines SL, and the reference source line RSL preferably the same drive load capacitance. As shown in the reference bit line RBL and the reference source line RSL of FIG. 1, the bit lines BL and the source lines SL may extend across the memory cell array 11 and the reference cell array 12. Then, in the memory array 10, the bit lines BL and the reference bit line RBL have the same drive load capacitance, and the source lines SL and the reference source line RSL have the same drive load capacitance. As a result, high-accuracy, high-speed read operation is provided. Alternatively, at least the bit lines BL or the source lines SL may extend across the memory cell array 11 and the reference cell array 12, and at least the reference bit line RBL or the reference source line RSL may extend across the memory cell array 11 and the reference cell array 12.

As shown in FIG. 9B, the ground voltage VSS (0 V) may be applied to the source terminals of dummy reference cell transistors DT. As a result, when one of the reference word lines RWL is driven, channels are formed in the dummy reference cell transistors DT coupled to the reference word line RWL, similar to the cell transistors of the non-selected memory cells. The non-selected memory cells are coupled to the non-selected bit lines BL and the non-selected source lines SL supplied with the ground voltage VSS. Since the cell transistors of the non-selected memory cells and the dummy reference cell transistors have the same gate load capacitance, the word lines WL and the reference word lines RWL have approximate drive load capacitances. As a result, higher-accuracy, higher-speed read operation is provided.

In FIG. 9B, the ground voltage VSS is applied to the source terminals of the dummy reference cell transistors DT only. Instead, the ground voltage VSS may be applied to the drain terminals of the dummy reference cell transistors DT only, or both of the source terminals and the drain terminals of the dummy reference cell transistors DT.

In FIG. 9B, similar to FIG. 9A, the bit lines BL and the source lines SL may extend across the memory cell array 11 and the reference cell array 12 so that the bit lines BL and the reference bit line RBL have the same drive load capacitance, and the source lines SL and the reference source line RSL have the same drive load capacitance.

Figure 10:
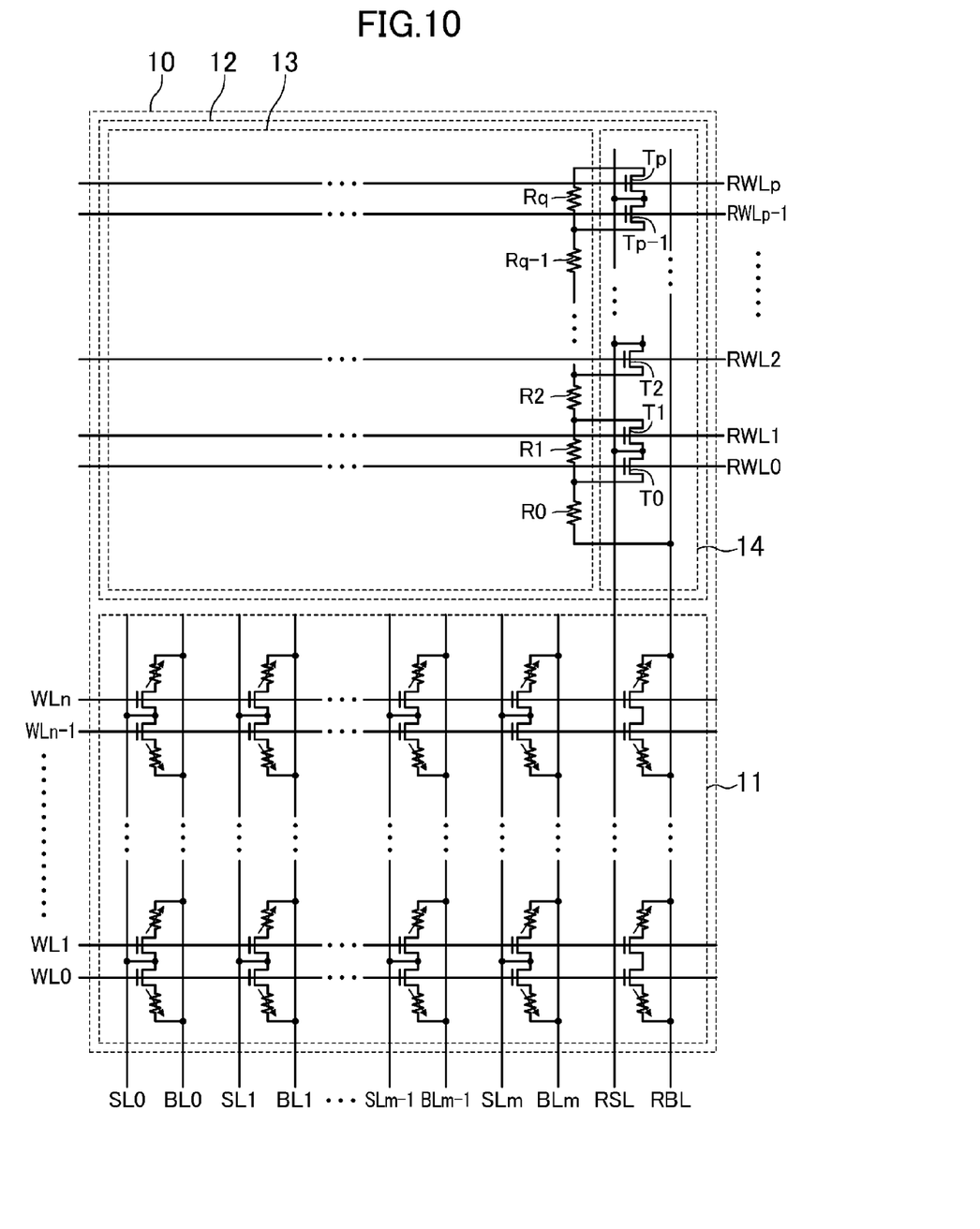
FIG. 10 is a configuration diagram of another example memory array of FIG. 1.

FIG. 10 is a configuration diagram of another example memory array of FIG. 1. Different from the memory array 10 of FIG. 1, a fixed resistance element block 13 and a reference cell transistor block 14 are aligned horizontally in a memory array 10 of FIG. 10. In FIG. 10, reference word lines RWL are not coupled to the fixed resistance element block 13 by polysilicon wires but, for example, coupled to an upper layer by metal wires. The reference word lines RWL are coupled to the reference cell transistor block 14 by polysilicon wires. By coupling in this manner, the fixed resistance element block 13 including fixed resistance elements R0-Rq is placed on the left of the reference cell transistor block 14 in FIG. 10.

In FIG. 1, the fixed resistance element block 13 is placed between the memory cell array 11 and the reference cell transistor block 14. The fixed resistance element block 13 is not necessarily located in this position. As shown in FIG. 10, the fixed resistance elements R0-Rq may be arranged in parallel to the reference bit line RBL.

Figure 11:
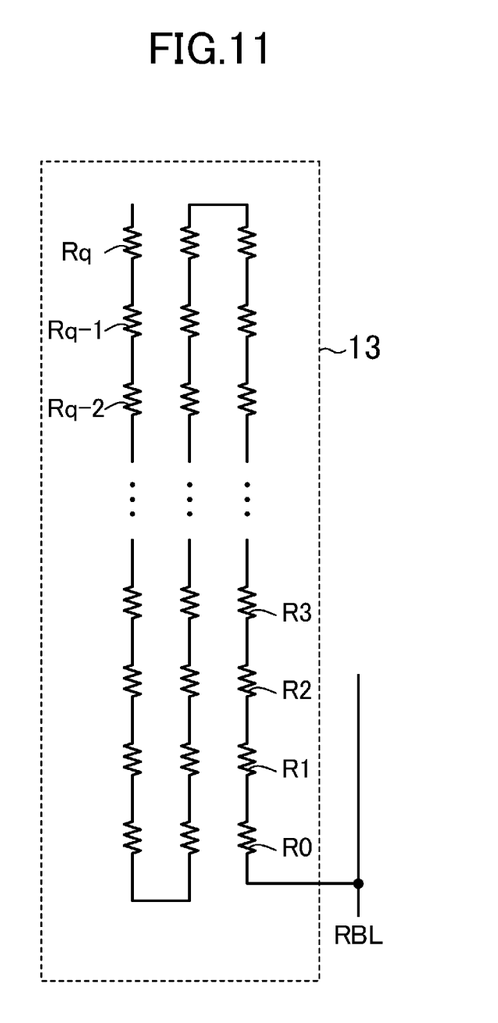
FIG. 11 illustrates another example configuration of a fixed resistance element block of the memory array of FIG. 10.

FIG. 11 illustrates another example configuration of the fixed resistance element block in the memory array shown in FIG. 10. If the plurality of fixed resistance elements R0-Rq cannot be arranged in a straight line, for example, a fixed resistance elements R may be arranged in a plurality of columns and the columns may be coupled together by a bent wire as shown in FIG. 11. In FIG. 11, the columns of the fixed resistance elements R are parallel to a reference bit line RBL. In FIG. 11, the position(s) and the number of bending the wire coupling the fixed resistance elements R may be determined as appropriate. In FIG. 11, as shown in FIG. 8B, at least one of the single fixed resistance elements R may be coupled in parallel. The fixed resistance element block 13 of FIG. 11 is the same as that of FIGS. 8A and 8B, except for the arrangement direction of the fixed resistance elements R.

In FIG. 10, the plurality of fixed resistance elements R may be arranged as shown in FIGS. 8A and 8B or as shown in FIG. 11.

While the embodiment of the present disclosure has been described as above, the non-volatile semiconductor memory device according to the present disclosure is not limited to the above-described examples. Various changes and modifications are susceptible within the scope and spirit of the present disclosure.

While in this embodiment, an example has been described where the variable resistance elements are used as variable resistance memory elements, variable magnetroresistance elements, phase change elements, and ferroelectric elements may be used instead. That is, the non-volatile semiconductor memory device according to this embodiment is also applicable to non-volatile variable magnetororesistance memories (e.g., magnetoresistive random access memories (MRAMs)), non-volatile phase change memories (e.g., phase change random access memories (PRAMs)), and non-volatile ferroelectric memories (e.g., ferroelectric random access memories (FeRAMs)).

In the non-volatile semiconductor memory device shown in FIG. 1, the coupling points of the plurality of series-coupled fixed resistance elements R are coupled to the drains of the plurality of reference cell transistors T. All of the coupling points of the fixed resistance elements R may not be coupled to the drains of the reference cell transistors T. For example, the coupling points between the fixed resistance elements R2 and R3 may not be coupled to the drain of the reference cell transistor T2, and the reference cell transistor T2 may be omitted.

In this embodiment, the first data lines may be the source lines SL, and the second data lines may be the bit lines BL. In this case, the first reference data line is the reference source line RSL, and the second reference data line is the reference bit line RBL.

Specifically, in each memory cell MC, one end of the cell transistor is coupled to the corresponding bit line BL, and one end of the variable resistance element is coupled to the corresponding source lines SL. The drain terminals of the reference cell transistors T are coupled in common to the reference bit line RBL. The source terminal of each reference cell transistor T is coupled to one of the coupling points of the fixed resistance elements R0-Rq or the left end of the fixed resistance element block 13 (i.e., the fixed resistance element Rq). The right end of the fixed resistance element block 13 (i.e., the fixed resistance element R0) may be coupled to the reference source line RSL.

In this embodiment, an example has been described where the bit lines BL, the source lines SL, the reference bit line RBL, and the reference source line RSL extend column-wise to be orthogonal to the word lines WL and the reference word lines RWL extend row-wise. Alternatively, the bit lines BL, the source lines SL, the reference bit line RBL, or the reference source line RSL may extend row-wise like the word lines WL and the reference word lines RWL.

What is claimed is:

1. A non-volatile semiconductor memory device comprising:
   a plurality of memory cells arranged in a matrix, each including a cell transistor and a variable resistance memory element coupled to one end of the cell transistor;
   a plurality of word lines corresponding to rows of the plurality of memory cells, and coupled in common to gates of the cell transistors included in the plurality of memory cells arranged in the respective rows;

a plurality of first data lines corresponding to rows or columns of the plurality of memory cells, and coupled in common to the variable resistance memory elements included in the plurality of memory cells arranged in the respective rows or columns;

a plurality of second data lines corresponding to the rows or the columns of the plurality of memory cells, and coupled in common to the other ends of the cell transistors included in the plurality of memory cells arranged in the respective rows or columns;

a plurality of fixed resistance elements coupled in series;

a plurality of reference cell transistors;

a plurality of reference word lines corresponding to the plurality of reference cell transistors, and coupled to gates of the respective reference cell transistors;

a first reference data line coupled to one end of a resistance path in which the plurality of fixed resistance elements are arranged; and a second reference data line coupled in common to one ends of the plurality of reference cell transistors, wherein the other end of each of the plurality of reference cell transistors is coupled to any one of coupling points of the fixed resistance elements or the other end of the resistance path.

2. The non-volatile semiconductor memory device of claim 1, wherein
the plurality of fixed resistance elements, the plurality of word lines, and the plurality of reference word lines are made of equivalent materials, and
the plurality of fixed resistance elements are arranged in parallel to at least the plurality of word lines or the plurality of reference word lines.

3. The non-volatile semiconductor memory device of claim 2, wherein
the plurality of fixed resistance elements and the plurality of word lines are made of polysilicon.

4. The non-volatile semiconductor memory device of claim 1, wherein
the plurality of fixed resistance elements are arranged in parallel to at least the plurality of first data lines or the plurality of second data lines.

5. The non-volatile semiconductor memory device of claim 4, wherein
the plurality of fixed resistance elements are made of polysilicon.

6. The non-volatile semiconductor memory device of claim 1, wherein
gate oxidation films of the plurality of cell transistors and the plurality of reference cell transistors have a same thickness.

7. The non-volatile semiconductor memory device of claim 1, wherein
the plurality of cell transistors and the plurality of reference cell transistors have a same gate channel length and a same gate channel width.

8. The non-volatile semiconductor memory device of claim 1, further comprising:
a sense amplifier configured to identify data stored in the plurality of memory cells; and
a column gate configured to couple any one of the plurality of first data lines being bit lines to the sense amplifier, and couple the first reference data line being a reference bit line to the sense amplifier.

9. The non-volatile semiconductor memory device of claim 1, further comprising:
a sense amplifier configured to identify data stored in the plurality of memory cells; and
a column gate configured to couple any one of the plurality of second data lines being bit lines to the sense amplifier, and couple the second reference data line being a reference bit line to the sense amplifier.

10. The non-volatile semiconductor memory device of claim 1, wherein
the plurality of fixed resistance elements are arranged in a plurality of rows in parallel to at least the plurality of word lines or the plurality of reference word lines, and the rows are coupled by a wire having a bend.

11. The non-volatile semiconductor memory device of claim 1, wherein
at least one of the plurality of fixed resistance elements includes a plurality of fixed resistance elements coupled in parallel.

12. The non-volatile semiconductor memory device of claim 1, further comprising:
a dummy transistor having a gate coupled to any one of the plurality of reference word lines.

13. The non-volatile semiconductor memory device of claim 12, wherein
gate oxidation films of the plurality of cell transistors, the plurality of reference cell transistors, and the dummy transistor have a same thickness.

14. The non-volatile semiconductor memory device of claim 12, wherein
the plurality of cell transistors, the plurality of reference cell transistors, and the dummy transistor have a same gate channel length and a same gate channel width.

15. The non-volatile semiconductor memory device of claim 12, wherein
a ground potential is applied to at least one of a drain or a source of the dummy transistor.

16. The non-volatile semiconductor memory device of claim 1, further comprising:
a reference cell array including the plurality of reference cell transistors and the plurality of fixed resistance elements, and being column-wise adjacent to a memory cell array including the plurality of memory cells, wherein
at least the plurality of first data lines or the plurality of the second data lines extend across the memory cell array and the reference cell array, and
at least one of the first reference data line or the second reference data line extends across the memory cell array and the reference cell array in a same direction as the plurality of first and second data lines.

17. The non-volatile semiconductor memory device of claim 1, wherein
the variable resistance memory element is a variable resistance element.

18. The non-volatile semiconductor memory device of claim 1, wherein
the variable resistance memory element is a variable magnetoresistance element.

19. The non-volatile semiconductor memory device of claim 1, wherein
the variable resistance memory element is a phase change element.

20. The non-volatile semiconductor memory device of claim 1, wherein the variable resistance memory element is a ferroelectric element.

* * * * *